United States Patent [19]

Olmstead et al.

[11] Patent Number: 4,968,989
[45] Date of Patent: Nov. 6, 1990

[54] SWITCHED CAPACITOR FILTER FOR USE WITH A DIGITAL-TO-ANALOG (D/A) CONVERTER

[76] Inventors: John A. Olmstead, 200 Stonybrook Rd.; Salomon Vulih, 681 H Dover Ct., both of, Somerville, N.J. 08876

[21] Appl. No.: 40,168

[22] Filed: Apr. 20, 1987

[51] Int. Cl.⁵ .............................................. H03M 1/66
[52] U.S. Cl. ...................................... 341/150; 341/122; 341/144
[58] Field of Search ................. 340/347 DA, 347 CC, 340/347 C, 347 M, 347 SH; 341/122, 144, 150, 172

[56] References Cited

U.S. PATENT DOCUMENTS

| | | | |
|---|---|---|---|
| 3,051,938 | 8/1962 | Levy | 340/347 DD X |
| 3,597,761 | 8/1971 | Fraschilla et al. | 340/347 AD |
| 4,363,025 | 12/1982 | Jackson | 340/347 DA |
| 4,483,017 | 11/1984 | Hampel et al. | 382/36 X |
| 4,573,033 | 2/1986 | Kolodin | 340/347 DA |
| 4,584,559 | 4/1986 | Penney | 307/352 X |
| 4,633,223 | 12/1986 | Senderowicz | 340/347 M X |

Primary Examiner—William M. Shoop, Jr.
Assistant Examiner—Brian Young

[57] ABSTRACT

The output of a digital-to-analog (D/A) converter is coupled to the input of a filter. The D/A converter is initialized each time a new digital word is applied to the D/A converter for conversion, whereby each data conversion cycle ($T_D$) includes an initialization interval ($T_I$) followed by a conversion interval ($T_C$). During $T_I$ the output of the D/A converter is driven to a reference level and during $T_C$ to the output of the D/A converter corresponds to the value of the input signal. The input section of the filter stores the D/A output just prior to initialization and, for during $T_I$, coupling the stored value within the filter for processing while inhibiting the coupling to the filter of the reference level present at the D/A output.

7 Claims, 4 Drawing Sheets

SWITCHED CAPACITOR FILTER FOR USE WITH A DIGITAL-TO-ANALOG (D/A) CONVERTER

FIELD OF THE INVENTION

The present invention is directed to improved filter means particularly useful in combination with certain types of digital-to-analog (D/A) converters.

BACKGROUND OF THE INVENTION

D/A converters function to produce at their outputs an analog level signal corresponding to the value of a digital word signal applied to their inputs D/A converters contemplated for use in practicing the invention are, normally, periodically "initialized" because the D/A converter output and some of its internal nodes may be at, or assume, undesirable levels. This is particularly true of a D/A converter which includes a capacitive voltage divider ladder network since charge may build up at various points of the ladder network resulting in offset voltages at various nodes. It is therefore necessary to periodically initialize the output, the input and the internal nodes of the D/A converter before, or after, each new digital word signal is applied to the D/A converter. Typically, the D/A converter is initialized just prior to the application of a new digital word to the input of the D/A converter. Where digital word signals are cyclically (or periodically) applied to a D/A converter, each data conversion cycle ($T_D$) includes an initialization interval ($T_I$) followed by an analog conversion interval ($T_C$). During the $T_I$, the output of the D/A converter is driven to a reference level and, during the $T_C$, the output of the D/A converter is driven to a level determined by the value of the inputted digital word.

It is known in the art to connect a filter, such as a switched capacitor filter, to the output of a D/A converter in order to smooth the wave shape (i.e. remove sharp discontinuities). By way of example, a known switched capacitor filter samples the output of a D/A converter during M (e.g. 16) equal subintervals or time units, where M is an integer, and during one of the M sample time units (normally, the first or last) the output of the D/A converter is set at a reference level amplitude. Typically, the switched capacitor filter includes a sample and hold input section for sampling the output of the D/A converter and storing the levels of the sampled signals, and an integrator, which integrates, or smoothes, the samples. The signal produced at the output of the integrator may then be processed further by succeeding filter stages.

The periodic initialization of the D/A converter, although necessary, introduces undesired, erroneous, or noise components into the signal produced at the D/A output. Each time the D/A converter is initialized, its output is switched, at the onset of initialization, from a level corresponding to an input signal to a level corresponding to a reference voltage and, at the termination of initialization, the output of the D/A converter is again switched from the reference level to a new signal level. Thus, due to the need for initializing the D/A converter, its output is switched twice during a short interval of time, producing discontinuities and high frequency noise components which are then applied to the filter. The introduction of these discontinuities and high frequency noise components into the system is undesirable since it requires additional filtering, which means added complexity and cost. Also, additional filtering delays the processing of the signal.

SUMMARY OF THE INVENTION

The problem associated with the generation of unwanted or "erroneous" levels during each $T_I$, where these unwanted levels occur within a stream of signals which represent information, is solved in circuits embodying the invention by storing the value of the signal produced at the output of the D/A converter just prior to the onset of the $T_I$. The value of signal stored just prior to the $T_I$ is then applied and continues to be applied to the filter circuit while the D/A converter is being initialized. The reference levels produced at the output of the D/A converter during the $T_I$ are not applied to the filter and do not affect the processing of the signal.

In a particular circuit embodying the invention, the output of a D/A converter is coupled by switch means, which includes a analog storage means, to an integrating circuit for filtering. The switch means includes means for sampling the output of the D/A converter just prior to the onset of the $T_I$ and to store the value of that signal on an analog storage means. With the onset of, and during, the $T_I$ the analog storage means is coupled to the integrating circuit and the D/A converter is decoupled from the analog storage means and the integrating circuit. The value of the signal applied to the integrating circuit is then the value of the signal present at the output of the D/A converter just prior to the $T_I$. This prevents the reference (non-signal) level produced at the output of the D/A converter during initialization from being applied to the input of the filter and enables a smoother more continuous wave shape to be produced at the output of the filter.

BRIEF DESCRIPTION OF THE DRAWINGS

The advantages of the present invention may be better understood with reference to the accompanying drawings, in which.

DETAILED DESCRIPTION

In the following description, like reference numbers are used in FIGS. 1 and 3 to designate apparatus of corresponding function. For ease of explanation, the term "control signal" refers to relatively positive portions of traces or positive going pulses, such as those shown in FIGS. 2 and 4.

Figure 1:
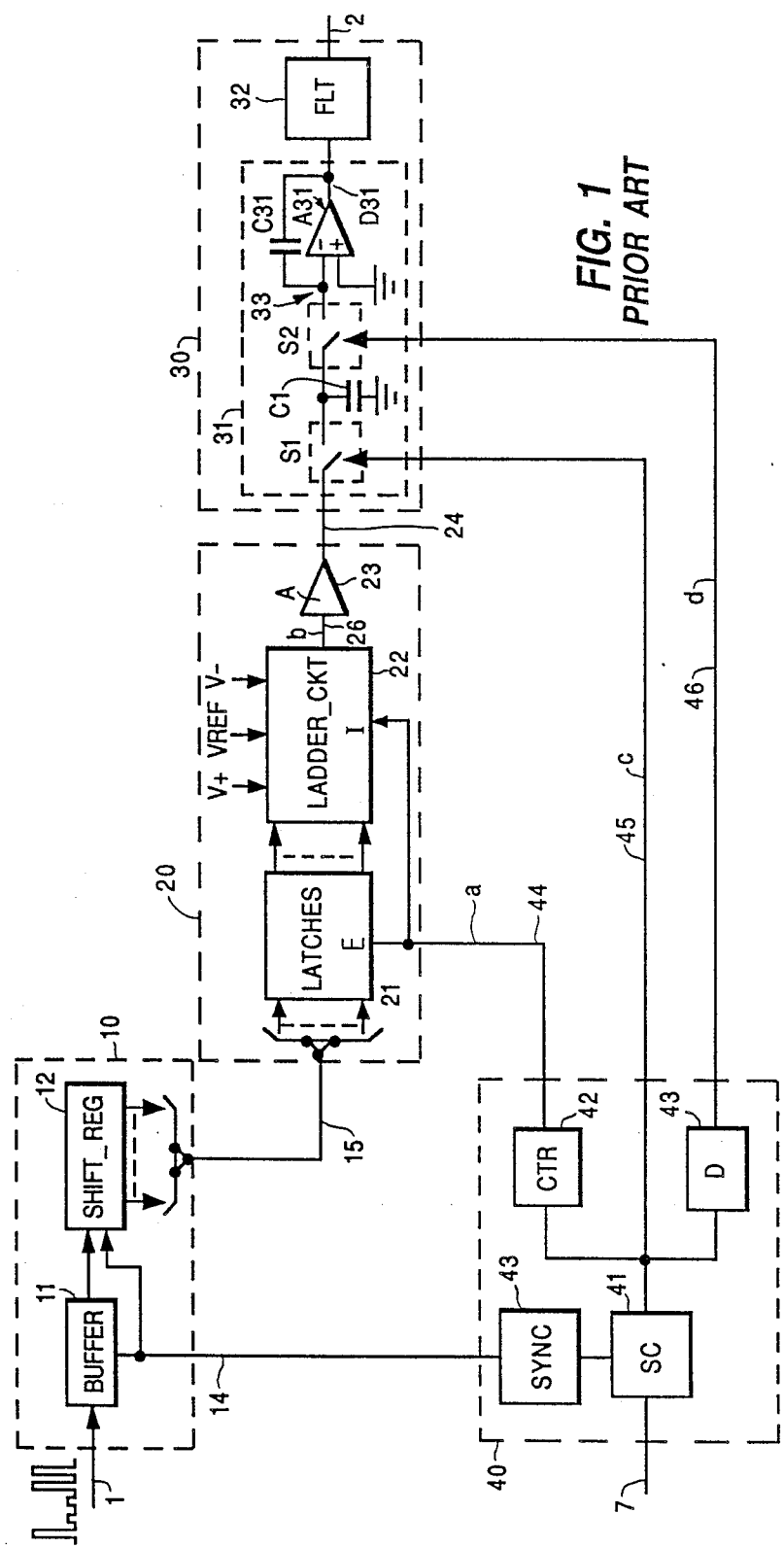
FIG. 1 is a schematic block diagram of a prior art D/A converter using a conventional switched capacitor filter.

The prior art D/A converter circuit shown in FIG. 1 includes an input section 10, a D/A converter section 20, a filter 30 and a synchronization, timing and control circuit 40.

In the circuit of FIG. 1, a stream of serially propagated digital input signals (pulses) is applied to an input terminal 1 of section 10. It may be assumed that the digital input signals (pulses) are applied in groups of N (e.g. eight) pulses, each group of N (e.g. eight) pulses defining a word, and each pulse representing either a logic "1"—e.g., full amplitude—or a logic "0"—e.g., negligible amplitude. The number of "ones" and "zeros" in each word define the amplitude of the corresponding analog signal eventually generated at the output 26 of ladder circuit 22 and at the output 2 of the filter.

Input section 10 includes buffer 11 responsive to the stream of serially applied digital input signals at input terminal 1 and to control signals on line 14 from circuit 40 for passing digital input signals in groups of eight (i.e. one word at a time) to a shift register 12. Each one of the serially-occurring digital signals appearing at input terminal 1, is appropriately shaped in buffer 11. The shaped digital signals from buffer 11 are then clocked into shift register 12 under control of timing signals produced in circuit 40. Section 10 further includes a means for clocking-out of shift register 12, each 8 bit word at the same time, whereby each 8 serially propagated digital input signals corresponding to a word are transferred in parallel onto 8 lines comprising bus 15, and via bus 15 to the input of D/A converter circuit 20.

A/D circuit 20 includes latch circuitry 21, a ladder circuit 22 and an amplifier 23. Latch circuitry 21 includes latches, or flip-flops, which are responsive to, and store, the digital information received in parallel from shift register 12. The N (e.g., 8) binary bits of each inputted digital word assembled in register 12 of incoming section 10 and transferred in parallel, via conductors 15, to the inputs of latches 21 are stored in latches 21, in response to an "a" control signal, of the type shown as "a" of FIG. 2, applied to enabling input E of latches 21. The digital outputs of the latches in circuit 21 are applied to the input of ladder circuit 22 which converts the digital information present at its input into an analog level at its output 26. Ladder circuit 22 may be, for example, a capacitive ladder of the type shown in FIG. 1 of U.S. Pat. No. 4,641,130 entitled "Analog-to-Digital Converter with Scaling of Input Signal" to Mastroianni or in U.S. Pat. No. 4,380,756 entitled "Charge Redistribution Circuit Having Reduced Area" to Worsman or U.S. Pat. No. 4,195,282 entitled "Charge Redistribution Circuits" to Cameron. The output 26 of ladder circuit 22 is connected to the input of an operational amplifier 23 whose output is connected to an output line 24 which is connected to the input of a switch capacitor filter 30.

For ease of the description to follow, assume that digital words are applied to the input of the D/A converter cyclically (e.g. at the rate of 8 KH$_z$), with a different digital word being applied each cycle (e.g. a different word being applied every 125 microseconds). Assume further that: (a) during each data conversion cycle ($T_0$)—typically, at the beginning of each cycle—the D/A converter is initialized for $T_I$, shown extending from time $t_{11}$ to time $t_{12}$ in FIG. 2, and that, during each $T_I$, the output of the D/A converter is set at a reference level, $V_{REF}$, as shown in waveforms b and f; and (b) that during the $T_C$ of each cycle, the analog signal information is produced at the output 24 of the D/A converter corresponding to the value of the inputted digital word.

Converter circuit 20 is initialized once each cycle, from a time $t_{\eta 1}$ to a time $t_{\eta 2}$, (where $\eta$ is an integer indicating the cycle number) by the application of an "a" pulse signal via conductor 44 to initialization input I of ladder circuit 22. During each $T_I$ (e.g. time $t_{\eta 1}$ to $t_{\eta 2}$) ladder circuit 22 produces at its output 24 a reference-level amplitude, as shown in traces b and f of FIG. 2. The initialization operation of ladder circuit 22 is known and need not be further detailed.

At the end of each $T_I$ (times $t_{12}$ and $t_{22}$ in FIG. 2) the initialization operation of circuit 20 is complete. Thereafter, ladder circuit 22 produces at output 26 the correct analog information (i.e. analog information corresponding to the value encoded in the digital word being processed) until the onset of the next $T_I$. Thus, as shown in trace b of FIG. 2, within the initialization part of each cycle output 24 assumes a reference level amplitude and during the remaining part the interval assumes an information-indicating level.

Filter 30 includes a switched capacitor integrator circuit 31 and additional filter stages 32. Switched capacitor integrator 31 includes a first switch S1, a second switch S2, and a capacitive (or analog) storage means C1. The combination of S1, C1 and S2 functions as a frequency dependent resistor connected between conductor 24, which also functions as the filter input, and "summing" node 33. Node 33 is referred to as the summing node since the input and feedback currents are summed at that point. The rate at which S1 and S2 are switched determines the equivalent resistance of the network (S1, C1, S2), as is known in the art. See, for example, U.S. Pat. Nos. 4,483,017 entitled "Pattern Recognition System Using Switched Capacitors" to Hampel et al. and 4,429,285 entitled "Frequency-Controlled Variable-Gain Amplifiers" to Bradshaw. Each of switches S1 and S2 is indicated in FIG. 1 as being a mechanical type, open-close switch. However, it should be understood that other types of switches, such as single conductivity type, or complementary, transistor transmission gates, and/or as shown in the references cited above, can be used to accomplish the function of each of switches S1 and S2. Each of switches S1 and S2 has a control input and is enabled (closed) by the application to its control input of a positive going pulse. Switches S1 and S2 are alternately enabled, M (e.g. 16) times during each $T_I$ and $T_C$, by means of non-overlapping pulses applied to conductors 45 and 46.

Figure 2:
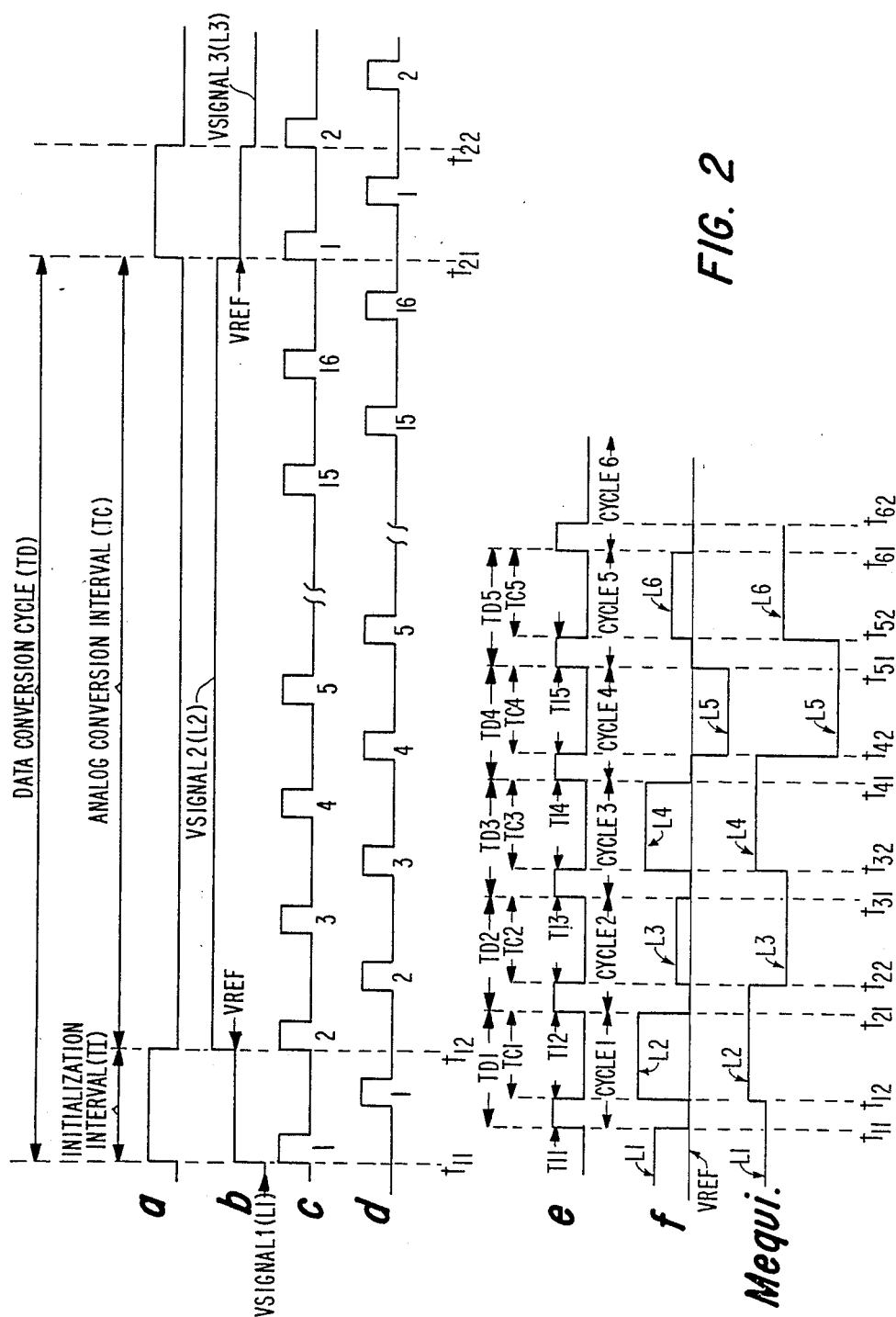
FIG. 2 includes traces a–d of signals which appear at like-lettered points within the FIG. 1 D/A converter and includes traces e, f and Mequi for comparing the output (trace f) of the D/A converter of FIG. 1 with the equivalent output (trace Mequi) of the D/A converter of FIG. 3 embodying the invention; with traces e, f and Mequi being drawn to a different scale than traces a–d.

Switch S1, in response to a control signal "c" such as shown in FIG. 2, samples the analog signals present on line 24 and couples the sampled signal to capacitor C1, whereby the sampled signal is stored on capacitor C1. Switch S2, responsive to control signals "d" of the type shown in FIG. 2, couples the signals stored on capacitor C1 to summing node 33 of the integrator. The integrator includes an integrating capacitor C31 and an operational amplifier A31 having a negative (−) input terminal, a positive (+) input terminal and an output terminal 031. Capacitor C31 is connected between the output terminal 031 and the negative input terminal of A31 which is connected to summing node 33. The positive input terminal is shown returned to ground. The output 031 is coupled via additional filtering means 32 to output terminal 2.

Timing and control circuit 40 includes means responsive to control signals applied to bus 7 and to circuitry in synchronizing means 43 to synchronize the operation of input section 10 to the operation of converter circuit 20 and filter 31 by means of synchronizing timing signals produced in circuit 40. Circuit 40 includes synchronizing means 43 to operate input section 10 at a rate appropriate to the rate at which assembled words are available for application to latches 21, and in order to synchronize the operation of filter 31 to the operation of latches 21 and ladder circuit 22. The synchronizing means may be any of a number of known circuits and need not be described in detail.

Circuit 40 also includes a source of clock (SC) pulses 41, also responsive to control signals on bus 7, whose output (the "c"-clock pulses also referred to as the "c" control signals) is connected to the clock (CLK) input of a counter circuit 42 for producing "a"-control signals, as shown in FIG. 2, which are coupled via line 44 to the input (E) of latches 21 and to an input (I) of ladder circuit 22. One "a" pulse is produced for a number M of "c"-pulses, where M is an integer such as 16, as shown in FIG. 2. The "a" pulse signals are equally spaced from each other in time and occur at a rate sufficient to admit each N-bit word assembled in register 12 to latches 21. The "c"-control signals are also coupled via line 45 to switch S1 for controlling the turn-on and turn-off of switch S1 and thereby controlling the sampling of the signal on line 24 and the transfer of the signal on line 24 to capacitor C1. The "c"-clock pulses are also applied to a delay (D) network 43 to produce a control signal "d" which is coupled via line 46 to switch S2. Control signal "d" controls the turn-on and turn-off of switch S2 and the transfer of the information from capacitor C1 to input node 33 of operational amplifier A31. The control signals a, c and d are shown in like named traces in FIG. 2. From the relationship of signals indicated in traces c, and d, it is seen that the positive going pulses on conductors 45 and 46, which function as control signals, do not overlap each other. The number M of "c"-pulses, and the number M of "d"-pulses produced during each data conversion cycle ($T_D$) define M subintervals or time units during each cycle.

The overall function of the circuit shown in FIG. 1 is: (a) to assemble at some fixed rate in input section 10 serially-occurring data bits, which are incoming to terminal 1, into N-bit words, N being an integer such as eight; (b) to couple, via "N" paths indicated collectively as 15, each assembled, N-bit word to a data input, comprising latches 21, of converter circuit 20; (c) to convert by means of ladder circuit 22 the value encoded in each inputted digital word into a corresponding analog level and to provide, through operational amplifier 23, at output 24 of converter circuit 20 a continuing analog signal corresponding to the value of the inputted digital signal; (d) to transfer samples taken during each of M (e.g. 16) equal length subintervals or time units of the analog signal interval through the sample-and-hold input section of switch capacitor filter stage 31 to the integrator of stage 31; and (e) to smooth in stage 31 and in succeeding filter stages (collectively indicated as 32) into a continuing stepped-level analog output signal at output 2.

At the beginning of each $T_I$, (times $t_{\eta 1}$) as shown in traces b and f of FIG. 2, the outputs 26 and 24 of D/A converter 20 are driven to a reference level, $V_{REF}$, regardless of the value of the previously read bit of information. Trace b depicts, essentially, one cycle at output 24, while trace f depicts the signal level at output 24 over several cycles. At the end of each $T_I$, (e.g. times $t_{\eta 2}$) as shown in FIG. 2, the outputs 26 and 24 are again driven to a level corresponding to the value of the input signal as shown in traces b and f. Thus, as is most evident by referring to trace f, during each $T_I$, the level at the output of the ladder circuit is switched twice between two different levels (the signal level and the reference level) in a very short period of time. Switching the output in this manner introduces high frequency noise and sharp discontinuities into the circuit. Also, applying the reference level to the filter for subsequent processing is equivalent to reading a false bit of information into the system since the reference level introduced into the system has no relevance to the actual value of the input signal. To smooth out the added discontinuities and to remove the added high frequency noise requires additional filtering.

In circuits embodying the invention, the effect of the reference level imposed on the ladder network during the initialization cycle is prevented from affecting the rest of the circuit. As shown in FIG. 3 and as detailed below, in circuits embodying the invention, only information corresponding to the actual input signal is introduced into the filter circuit and propagated for further processing. This eliminates the need for additional filtering required in the prior art.

Figure 3:
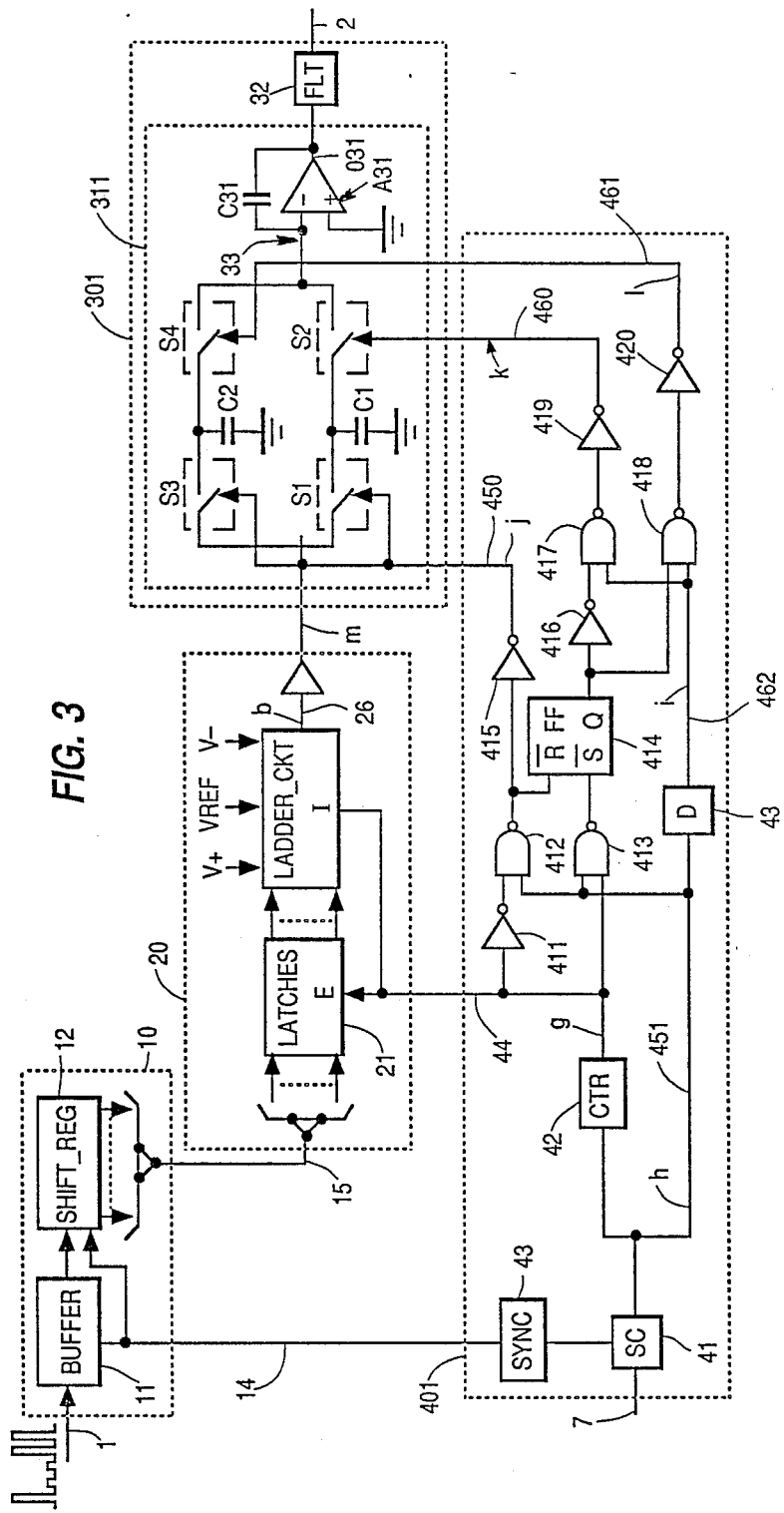
FIG. 3 is a schematic block diagram of an improved D/A converter embodying the present invention.

In the D/A converter of FIG. 3, as for the D/A converter of FIG. 1, serially propagated data bits are applied to input 1 and are assembled in section 10 into digital words of N-bits each, and the bits of each word are then applied in parallel to converter circuit 20, where N is an integer, such as eight. The operation of incoming section 10 in FIG. 3, like that of FIG. 1, is synchronized to the operation of timing circuit 40. The N-bits of each word assembled in incoming section 10 are applied in parallel to the data input of converter circuit 20. Converter circuit 20 admits an applied digital word to its data input and is initialized in response to control signals received over conductor 44 from a timing circuit 401. The operation of circuits 10 and 20 is similar to that set forth in the description of FIG. 1 and need not be repeated.

Timing circuit 401 in FIG. 3, like timing circuit 40 in FIG. 1, includes a continuously operating clock pulse source 41 which is also responsive to control signals on bus 7. During each data conversion cycle ($T_D$) at the source 41 produces M regularly spaced "h"-clock pulses (indicated in trace h of FIG. 4); where M is, for example, an integer, such as 16. As in FIG. 1, the "h"-clock pulses from source 41 of FIG. 3 are applied to the input of counter 42, causing counter 42 to produce "g"-pulse signals (indicated in trace g of FIG. 4) on conductor 44 which are used as initialization signals at the inception of each data conversion cycle. The "h"-clock pulses of source 41 in FIG. 3 are also applied via conductor 451 to delay device 43 to provide a set of "i"-pulses on conductor 462 (indicated in trace i of FIG. 4) which do not overlap the "h"-pulses on conductor 451.

Switched capacitor filter 311 shown in FIG. 3 includes a first switch means comprised of first and third switches S1 and S3, and a second switch means comprised of second and fourth switches S2 and S4. Switched capacitor filter 311 also includes a first capacitor C1 and a second capacitor C2. Each of switches S1 and S3, when enabled, connects the input of filter 311 to a respective one of capacitors C1 and C2. Each of second and fourth switches S2 and S4, when enabled, connects a respective one of capacitors C1 and C2 to "summing" node 33. Each of switches S1, S2, S3 and S4 may be a single transistor, or a complementary transistor, transmission gate, as discussed for switches S1 and S2 earlier in connection with FIG. 1. The control inputs for switches S1 and S3 are connected together and to an output conductor 450 of circuit 401. The control input of each one of switches S2 and S4 is connected to a respective one of output conductors 460 and 461 of circuit 401.

Timing circuit 401 of FIG. 3 produces on its output conductor 450 the "j"-control signals (indicated in trace j of FIG. 4) which enable both switches S1 and S3 concurrently, a number (M−1) times during each $T_C$. Circuit 401 also produces on its output conductor 460 the "k"-control pulses (indicated in trace k of FIG. 4), which enables switch S2 a number (M−1) times during each $T_C$. The "k"-pulses do not overlap the "j" pulses whereby when S1 (and S3) is ON, S2 is OFF and when S2 is ON, S1 (and S3) is OFF. Furthermore, the production of "j" and/or "k" pulses is inhibited during $T_I$, whereby switches S1, S3 and S2 remain open (OFF) during each $T_I$.

During each $T_I$, timing circuit 401 produces an "1"-pulse (indicated in trace l of FIG. 4) on conductor 461, which enables switch S4 and causes the transfer of the pre-initialization signal stored on capacitor C2 to node 33.

Before discussing the circuit and operation of FIG. 3 in detail, note that the circuit of FIG. 3 defines over the circuit of FIG. 1 in the following significant respects:

1—Filter 311 is modified relative to filter 31 in that an additional capacitor C2 is provided together with switching means S3 and S4 for also sampling and storing the signals produced at the output 24 of D/A converter 20, and for selectively coupling the stored signal to node 33 of the integrator; and 2—Timing and control circuit 401 is modified relative to circuit 40 to produce the necessary control signals to operate filter 311 such that: (a) capacitor C2 samples and stores via switch S3 the "analog" signal produced at the output 24 of D/A converter 20 just prior to $T_I$; (b) during $T_I$, filter 311 is decoupled from the output 24; and (c) capacitor C2 is coupled via switch S4 to node 33 of the integrator during $T_I$ whereby the pre-initialization signal stored on C2 is passed to the integrator and the analog level corresponding to the value of the input signal just prior to $T_I$ continues to be applied to the integrator for further processing through the filter.

The operation of the circuit of FIG. 3 is outlined below with reference to FIG. 4.

Assume that prior to time $t_{11}$, a signal having a level L1 is present at output 24 and is being stored on capacitor C2. With the onset of $T_I$, at time $t_{11}$, the "g"-pulse goes positive and output 24 is driven to a reference level, $V_{REF}$, as shown for trace m of FIG. 4. Since the "j"-signal remains low during the initialization interval, switches S1 and S3 remain open (turned-off). Consequently, the reference level at output 24 does not get transferred to C1 and/or C2. Since the "k"-signal also remains low during the initialization interval, switch S2 also remains open (turned-off) and the signal level present on C1 is not coupled to node 33. The L1 signal being stored on C2 is a valid and unadulterated analog representation of the input signal since switch S3 was used to couple the level L1 during a time interval preceding $T_I$ and, since that time, S3 remained open and switch S4 was not closed.

When the "1"-signal goes positive at time $t_{1a}$, during $T_I$, switch S4 is enabled (closed or turned-on) and the L1 level stored on C2 is transferred to summing node 33 of the integrator. Consequently the signal transferred to node 33 during the initialization interval has the same value or level as the signal applied to node 33 just prior to the initialization interval. The input circuit supplied to node 33 during $T_I$ then has a value determined by a voltage or signal level as shown in trace M-equivalent of FIG. 4. At the termination of $T_I$, at time $t_{12}$, the "g"-signal returns to the "low" level and the output 24 of A/D converter 24 is driven to a true signal level (e.g. signal level L2 in trace m of FIG. 4). On the next "j"-pulse, shown as j1 in FIG. 4, S1 and S3 are enabled and the signal level L2 is sampled by S1 and S3 and stored on capacitors C1 and C2, respectively. On the next "k"-pulse, shown as k1 in FIG. 4, S2 is enabled and the L2 level stored on C1 is transferred to node 33. The L2 level stored on C2 due to j1 remains stored on C2 until the next "j" pulse, shown as j2 in FIG. 4, when the level at output 24 is transferred onto capacitors C1 and C2. However, C2 remains in whatever state to which it is set (i.e. undisturbed) since its information is not read out. Assuming the level L2 to remain constant until time $t_{21}$, the signal level L2 coupled to node 33 remains constant. Thus at time $t_{1,16}$ when the j(M−1) pulse goes positive, where the j(M−1) pulse is the 15th "j" pulse since the termination of the initialization interval at time $t_{1,2}$, the L2 level is again applied to C1 and C2 via switches S1 and S3. On the next "k"-pulse, shown as k(M−1) in FIG. 4, the signal stored on C1 is transferred to node 33. The transfer may disturb the level on C1. However, note that capacitor C2 remains undisturbed and stores a true level L2 since S4 remains turned-off and S3 is now open. At time $t_{21}$, a $T_I$ is instituted and output 24 goes to the reference level. But, during the $T_I$, there is neither a "j"-pulse nor a "k"-pulse. Hence switches S1, S2 and S3 remain turned-off. Now, the "1"-pulse occurring at time $t_{2a}$, identified as 1m in FIG. 4, causes the level L2 stored on C2 to be transferred to node 33. It is therefore evident that while the output 24 of the D/A converter is switched at the onset of each initialization period between an analog signal and the reference level and at the end of each initialization period between the reference level and a new analog level, the signal transferred to node 33 and through the filter is always switched only between analog signal levels. The signal processed by the integrator is then as shown in trace M-equivalent of FIGS. 2 and 4. Note that in FIG. 2 trace M-equivalent has been drawn below trace f and for several cycles to highlight the response of the circuit of the invention when compared to the prior art circuit. Thus, circuits embodying the invention eliminate from the signals being processed by the filter the high frequency noise components and the level switching introduced at the D/A output due to the need for initializing.

It is significant that C2 functions as an analog storage means and stores a pre-initialization signal (i.e. a level corresponding to the value of the input signal just prior to initialization). It is also significant that Applicants recognized that the prior art filter could be modified by the addition of switches S3 and S4 and analog storage means C2 without affecting the integrating of integrator 31.

The desired pattern of control signals on output conductors 450, 460, and 461, is produced by means of inverters 411, 415, 416, 419, and 420; NAND circuits 412, 413, 417, and 418; and set-reset type flip-flop 414, all connected together as indicated in FIG. 3. Clock pulse source 41, delay device 43, and counter 42 function as described in connection with FIG. 1.

Figure 4:
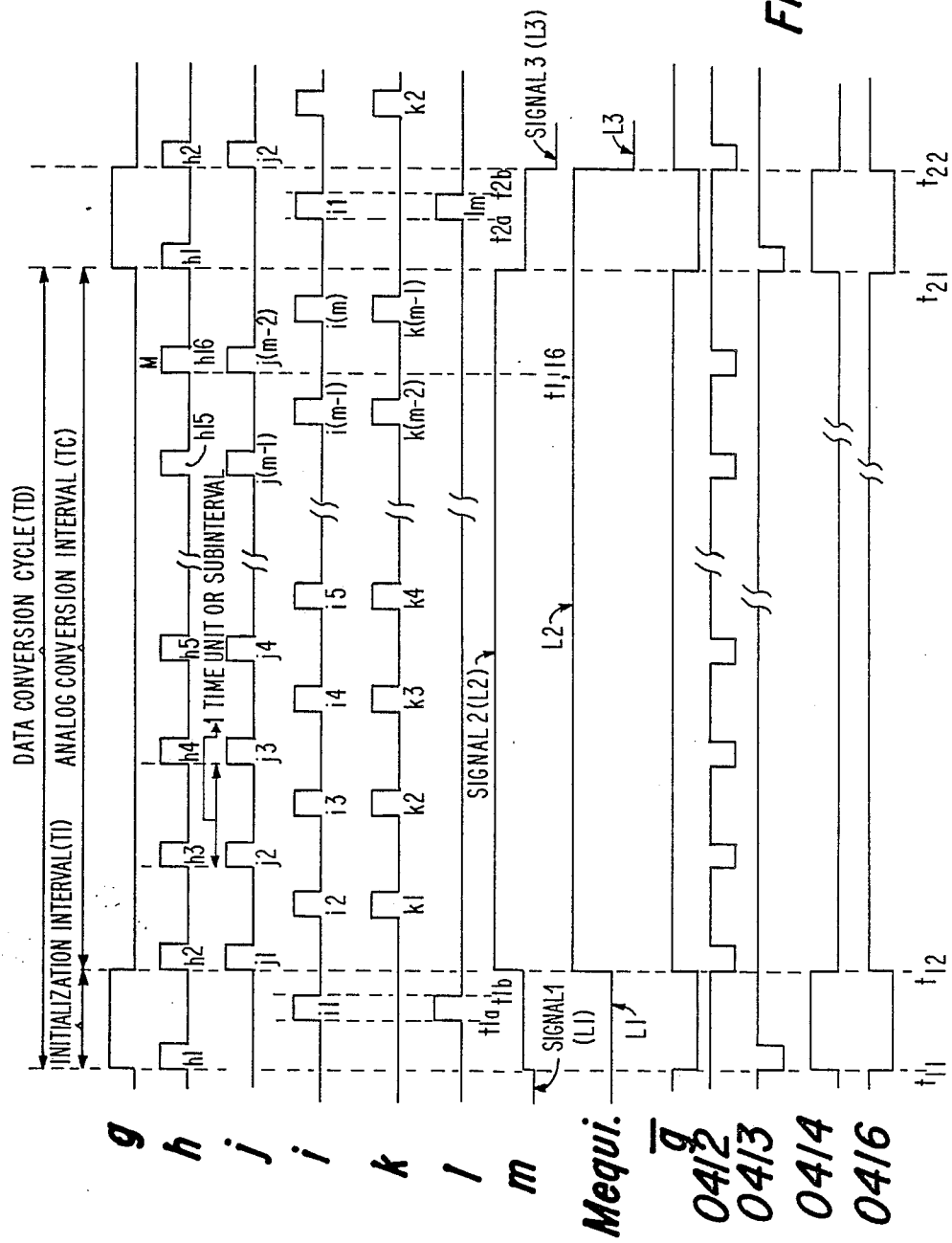
FIG. 4 includes traces of signals which appear at like-lettered points within the FIG. 3 D/A converter.

The operation of the timing and control circuit 401 of FIG. 3 may be best understood with reference to FIG. 4.

As noted above, clock source 41 produces "h"-pulses as shown in a like named trace of FIG. 4. On the leading (positive) edge of every 16th or Mth "h"-pulse applied to counter 42, the output "g" of counter 42 goes "high" and remains "high" until the leading (positive) edge of the next "h"-pulse at which point "g" goes low and an analog conversion interval (Tc) is initiated. The "g"-signal is applied to one input of NAND gate 413 and to inverter 411 whose output, which is the equivalent of ḡ, is applied to one input of NAND gate 412. The "h"-pulses are applied to the second inputs of gates 412 and 413. The output 0412 of NAND gate 412 is applied to inverter 415 at whose output are produced the "j"-pulses which control the turn-on and turn-off of switches S1 and S3. Note that a "j"-pulse is produced each time an "h"-pulse is produced except during the initialization period when the "g"-pulse is high. The output 0412 is applied to the R̄ input of FF 414 and the output 0413 of NAND gate 413, shown in like named trace in FIG. 4, is applied to the S̄ input of FF 414.

The Q output of FF 414 (shown in like named trace in FIG. 4) is applied to inverter 416 and to one input of NAND gate 418. The output 0416 of inverter 416, shown in a like named trace in FIG. 4, is applied to one input of NAND gate 417.

A signal "i", shown in a like named trace of FIG. 4, derived from signal "h" by a delay network 43 is applied to the second inputs of NAND gates 417 and 418. The delay 43 is designed to ensure that the positive going portion of the "i"-pulses do not overlap the positive going portion of the "h"-pulses, whereby the "j" and "k"-pulses do not overlap. This ensures that when S1 and S3 are closed (or enabled) that S2 (and S4) is disabled and that when S2 (and S4) is enabled (closed) that S1 and S3 are disabled.

Applying the output 0416 (which is the inverse of Q414) to NAND gate 417 and inverting the output of 417 via inverter 419 produces the "k"-pulses which are applied to the control arm of switch S2. There is one "k"-pulse produced per "j"-pulse, with the "k"-pulses being delayed relative to the "j"-pulses to ensure break-before-make operation of switches S1 and S2 and the appropriate propagation of the signal. It is evident from the operation of the circuit, that the circuit inhibits the production of a "j"-pulse and/or of a "k"-pulse during $T_I$.

The output (0418) of NAND gate 418 is applied to inverter 420 whose output is the "1"-signal having the form shown in the like named trace of FIG. 4. A positive going "1" pulse signal is produced, once each cycle, during $T_I$. The positive going "1"-pulse enables switch S4 and causes the transfer of the signal stored on capacitor C2 to the input node 33 of the integrator.

The circuitry shown in the FIG. 3 timing circuit 401 to produce the required pattern of control signals on conductors 450, 460, and 461 is by way of example only. It should be appreciated that many other configurations of logical devices (NANDs, inverters, flip-flops, etc.) may be used to produce similar control signals.

In the circuit of FIG. 3, the control inputs of switches S1 and S3 are connected together. As a consequence, during each conversion interval, switches S1 and S3 are concurrently enabled (M−1) times, switches S1 and S3 coupling an analog signal sample onto capacitors C1 and C2. Because all signals sampled during the (M−1) pulses of each analog signal interval are of uniform amplitude, the effect of such continuing sample storage on the profile of output sample sets is nil. It is evident that instead of enabling switch S3 each time switch S1 is enabled, S3 could be enabled once prior to each initialization interval to couple the then existing value of the analog level onto capacitor C2.

What is claimed is:

1. The combination comprising:
    a digital-to-analog (D/A) converter having an input to which are applied digital signals and having an output at which are produced analog signals corresponding to said digital signals, said D/A converter including means for periodically initializing said D/A converter during an initialization interval, whereby during each initialization interval the output of the D/A converter is set to a reference voltage level; and
    a filter having an input and an output; said filter being coupled at its input to the output of said D/A converter, said filter including means, comprising first and second switch means and a first capacitor, for selectively sampling, storing and processing the signals present at the output of said D/A converter, said filter also including means, comprising third and fourth switch means and a second capacitor, for selectively sampling and storing the "pre-initialization" signal present at the output of said D/A converter just prior to the initialization of said D/A converter and for processing said pre-initialization signal within said filter during said initialization interval, said filter further including means for inhibiting the processing within and via said filter of the signals present at the output of said D/A converter during said initialization interval.

2. The combination as claimed in claim 1 wherein said first switch means is coupled between said D/A output and said first capacitor;
    wherein said second switch means is coupled between said first capacitor and an intermediate node;
    wherein said third switch means is coupled between said D/A output and said second capacitor; and
    wherein said fourth switch means is coupled between said second capacitor and said intermediate node.

3. The combination as claimed in claim 2 wherein said filter further includes:
    (a) an operational amplifier having an input and an output, the input of said operational amplifier being connected to said intermediate node; and
    (b) an integrating capacitor connected between said output of said operational amplifier and said intermediate node.

4. The combination as claimed in claim 1 further including means for, during said initialization interval, enabling said fourth switch means and disabling said first, second and third switch means.

5. The combination as claimed in claim 1 wherein said filter includes:
    (a) an operational amplifier having an input and an output, said input being connected to a summing node;
    (b) an integrating capacitor connected between said amplifier output and said summing node:
    wherein said means for selectively sampling, storing and processing the signal present at the output of said D/A converter is coupled between said D/A output and said summing node; and
    wherein said means for selectively sampling and storing the pre-initialization signal and for processing said pre-initialization signal is coupled between said D/A output and said summing node.

6. The combination comprising:

a digital to analog (D/A) converter having an input to which are applied digital signals and having an output at which are produced analog signals corresponding to said digital signals, said D/A converter including means for periodically initializing said D/A converter during an initialization interval, whereby during each initialization interval the output of the D/A converter is set to a reference level; and a switch capacitor filter comprising:

an input terminal, an output terminal and a summing node;

means coupling the output of said D/A converter to said input terminal;

an operational amplifier having an input connected to said summing node and having an output connected to said output terminal;

an integrating capacitor connected between said output terminal and said summing node;

first, second, third and fourth switch means;

first and second analog storage means;

means connecting said first switch means between said input terminal and said first analog storage means for selectively coupling the signal at said input terminal onto said first analog storage means;

means connecting said second switch means between said first analog storage means and said summing node for selectively coupling the signal stored on said first analog storage means to said intermediate node;

means connecting said third switch means between said input terminal and said second analog storage means for selectively coupling the information at said input terminal onto said second analog storage means;

means connecting said fourth switch means between said second analog storage means and said summing node for selectively coupling the information stored on said second analog storage means to said intermediate node; and control means coupled to said first, second, third and fourth switch means for, during a predetermined time, $T_D$, enabling said first, second and third switches $(M-1)$ times, where M is an integer greater than 2, said control means further including means for enabling said first switch means when said second switch means is turned-off and for enabling said second switch means when said first switch means is turned-off, and said control means also including means for enabling said fourth switch means once during said predetermined period, $T_D$, and for, during the time said fourth switch means is enabled, disabling said first, second and third switching means.

7. The switched capacitor filter as claimed in claim 6 wherein said first and second analog storage means are capacitors.

* * * * *